United States Patent [19]

Weimer

[11] 4,291,239

[45] Sep. 22, 1981

[54] ARCHITECTURE LINE-TRANSFER CCD IMAGERS

[75] Inventor: Paul K. Weimer, Princeton, N.J.

[73] Assignee: RCA Corporation, New York, N.Y.

[21] Appl. No.: 124,103

[22] Filed: Feb. 25, 1980

[51] Int. Cl.³ .................. G11C 19/28; H01L 29/78; H01L 27/14; H01L 31/00

[52] U.S. Cl. .............................. 307/221 D; 357/24; 357/30

[58] Field of Search ................ 357/24, 30; 307/221 D

[56] References Cited

U.S. PATENT DOCUMENTS

| | | | |
|---|---|---|---|
| 3,934,261 | 1/1976 | Sequin | 357/24 |
| 4,041,521 | 8/1977 | Sunami et al. | 357/24 |
| 4,051,505 | 9/1977 | Krambeck et al. | 357/24 |
| 4,064,524 | 12/1977 | Hagiwara et al. | 357/24 |

OTHER PUBLICATIONS

Sequin "Two-Dimensional Charge-Transfer Arrays" IEEE J. Solid-State Circuits, vol. SC-9 (6/74) pp. 134-141.

Primary Examiner—Gene M. Munson
Attorney, Agent, or Firm—Samuel Cohen; George J. Seligsohn

[57] ABSTRACT

By replacing continuous channel stops with spaced channel-stop islands arranged in a plurality of rows, the substrate of an imager may be divided into a predetermined two-dimensional array of spaced charge-storage islands that communicate with one another through intervening charge-transfer regions. This permits the packing density of picture elements per unit substrate area to be nearly doubled and also reduces the noticeable distortion due to "blooming" in a television picture derived from such an imager.

24 Claims, 12 Drawing Figures

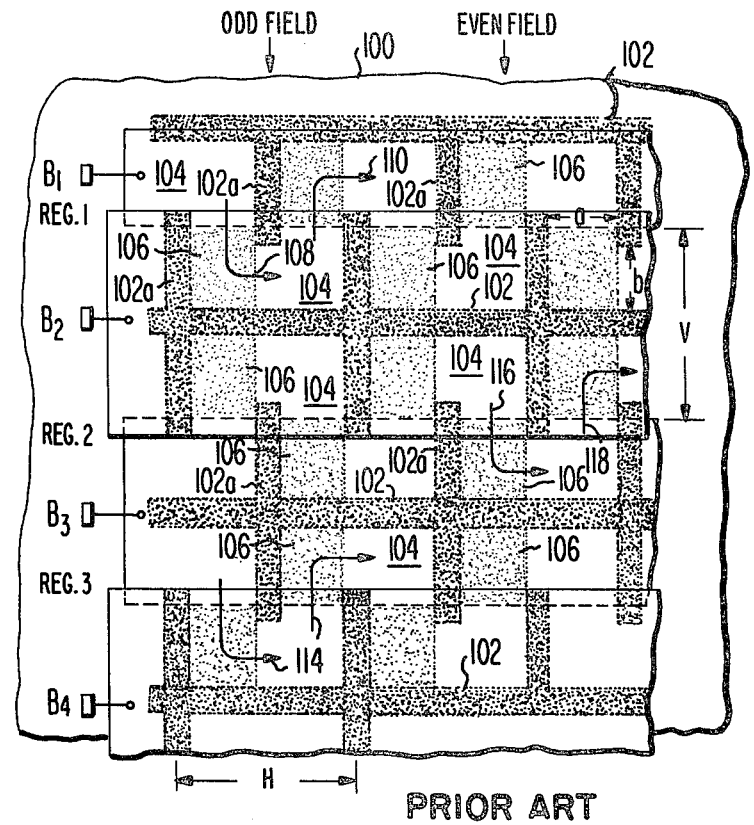
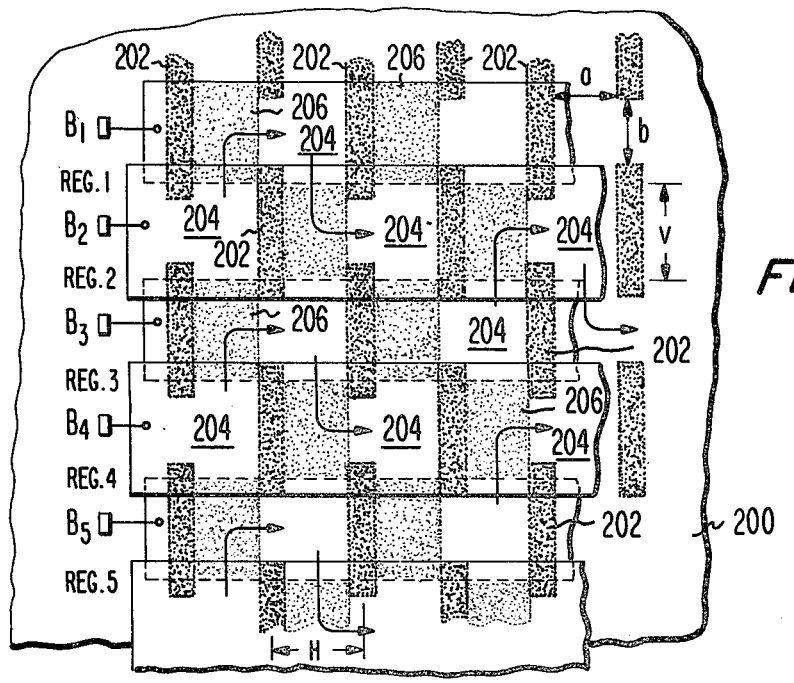

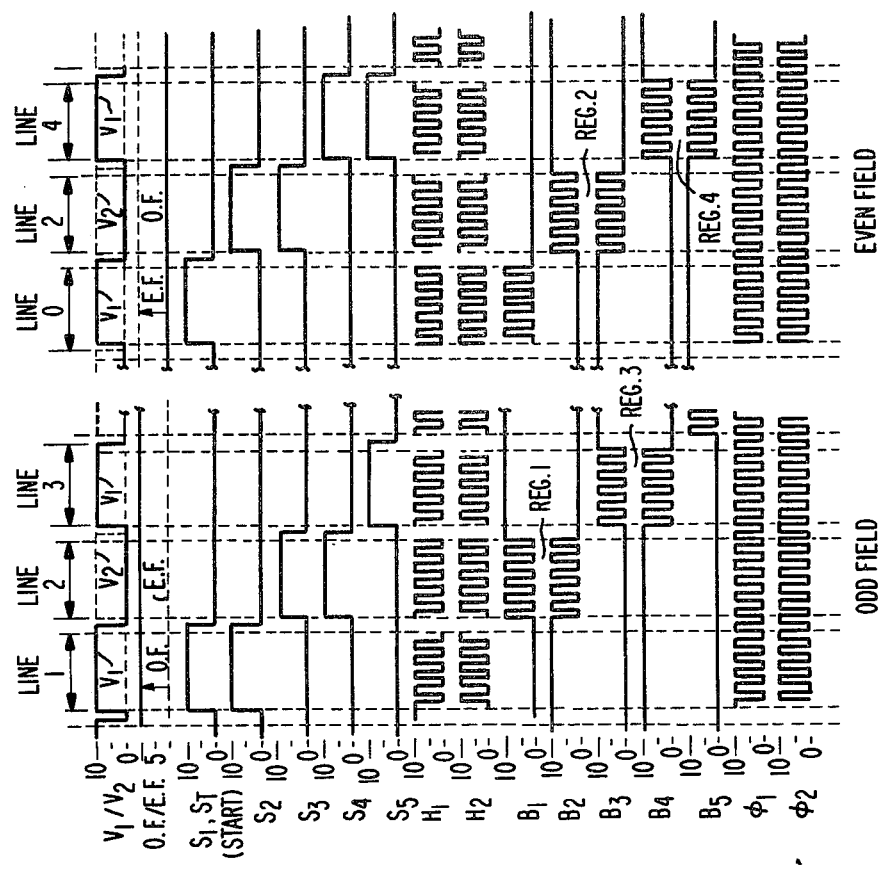
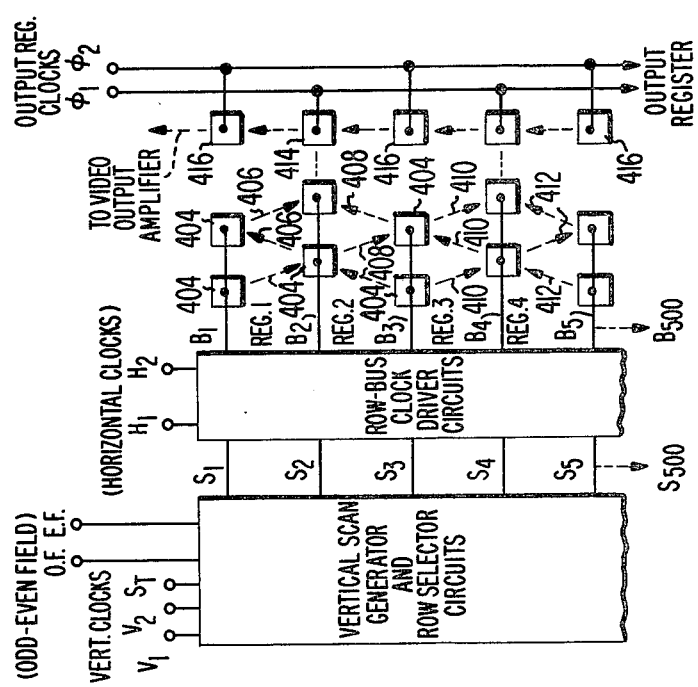
Fig. 4b
Fig. 4a

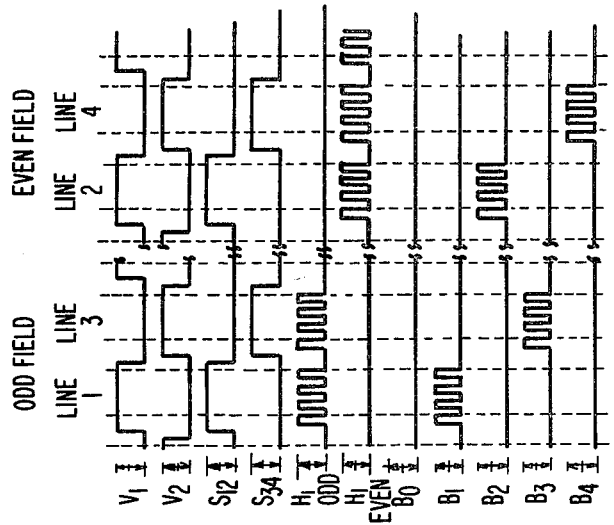
Fig. 9b
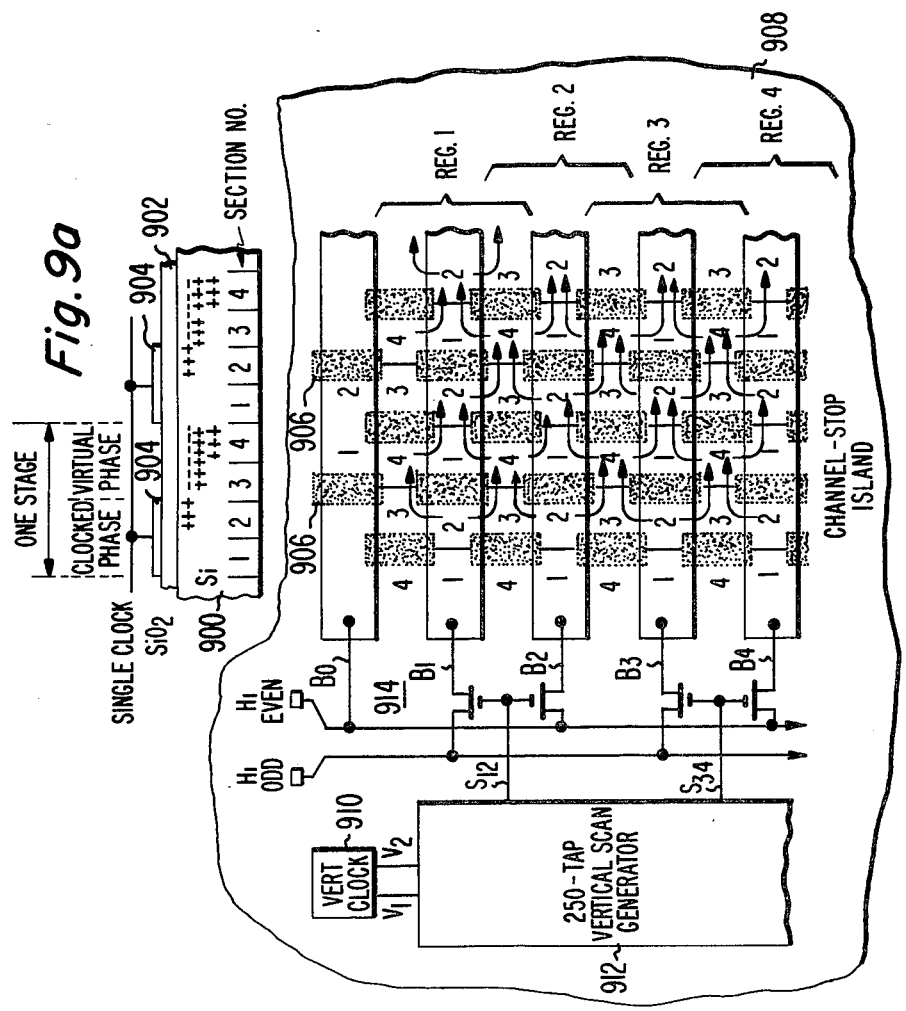
Fig. 9a
Fig. 9

ARCHITECTURE LINE-TRANSFER CCD IMAGERS

This invention relates to a charge transfer imager of the line transfer type and, more particularly, to such imagers having an improved structural architecture.

Horizontal line transfer imagers are known in the art and a number of different examples of such imagers are illustrated in U.S. Pat. No. 3,683,193 for "Bucket Brigade Scanning of Sensor Array," issued to the present inventor on Aug. 8, 1972. In imagers of this kind, the rows of the array are readout sequentially, each row being read out in serial fashion prior to the readout of the succeeding row. In the case of an imager of the charge transfer type, such as one of the bucket brigade or CCD type, the charge packets read serially from a row are translated to video signals and these are displayed on the screen of a display, such as a kinescope, in locations corresponding to those from which they originated in the imager.

Reference is made to my copending U.S. Pat. application Ser. No. 5073, filed Jan. 22, 1979 and assigned to the same assignee as the present application. This copending patent application is directed to a charge coupled device (CCD) imager of the line transfer type, in which a group of rows is read out at a time, with the charge packets in one row interleaved or read concurrently with those of the other row(s) of the group. Vertical interlacing is achieved by employing differently grouped rows for one field than are employed for the other field. Imagers disclosed in this co-pending application are suitable for color with a suitable array of color filters arranged in a particular pattern over the integration sites. The color filter pattern may be such that the color information in one field is arranged in the same pattern as it appears in the other field.

In the past, all imagers, whether of the line transfer type or the field (also known as "frame") transfer type, have been comprised of a plurality of separate charge-transfer channels, with adjacent channels being isolated from each other by such means as channel stops. In the case of the imagers disclosed in the aforesaid co-pending application, the channels are arranged in rows, with each row having a set of gate electrodes associated therewith. A distinguishing feature of imagers disclosed in this co-pending application is that the rows are shared by both odd fields and even fields, to thereby achieve vertical interlacing. More particularly, during odd fields, channel registers for the respective television lines are comprised of rows one and two; rows three and four; rows five and six, etc. During even fields, however, channel registers for the respective television lines are comprised of rows two and three; rows four and five; rows six and seven, etc. A similar arrangement for achieving vertical interlacing is also employed by the line transfer imager of the present invention.

The novel structure of the line transfer imager of the present invention does not employ a plurality of separate isolated continuous channels, as does the prior art. More particularly, in accordance with the principles of the present invention, a substrate surface is divided into a predetermined two-dimensional array of spaced charge-storage islands that communicate with one another through charge-transfer regions. The array defines a substantially uniform spatial distribution pattern of the storage islands and transfer regions in which the storage islands are arranged in n spaced rows numbered 1, 2 ... (n−1), n, with each row comprised of a plurality of spaced islands and with each island of each row being coupled through respective individual transfer regions to each of first and second neighboring islands of an adjacent row on one side thereof and also to each of first and second islands of an adjacent row on the other side thereof. Further, the spatial distribution is such that any selected row and at least one of the rows adjacent thereto forms a charge-transfer register for a separate line of picture elements in response to the application of predetermined control voltage signals to at least the selected row of the rows forming the charge-transfer register.

In the drawings:

FIG. 1 illustrates an example of the structural architecture of a prior art charge coupled device (CCD) line transfer imager comprised of separate, isolated charge-transfer registers;

FIG. 2 illustrates a first embodiment of the present invention;

Figure 3:
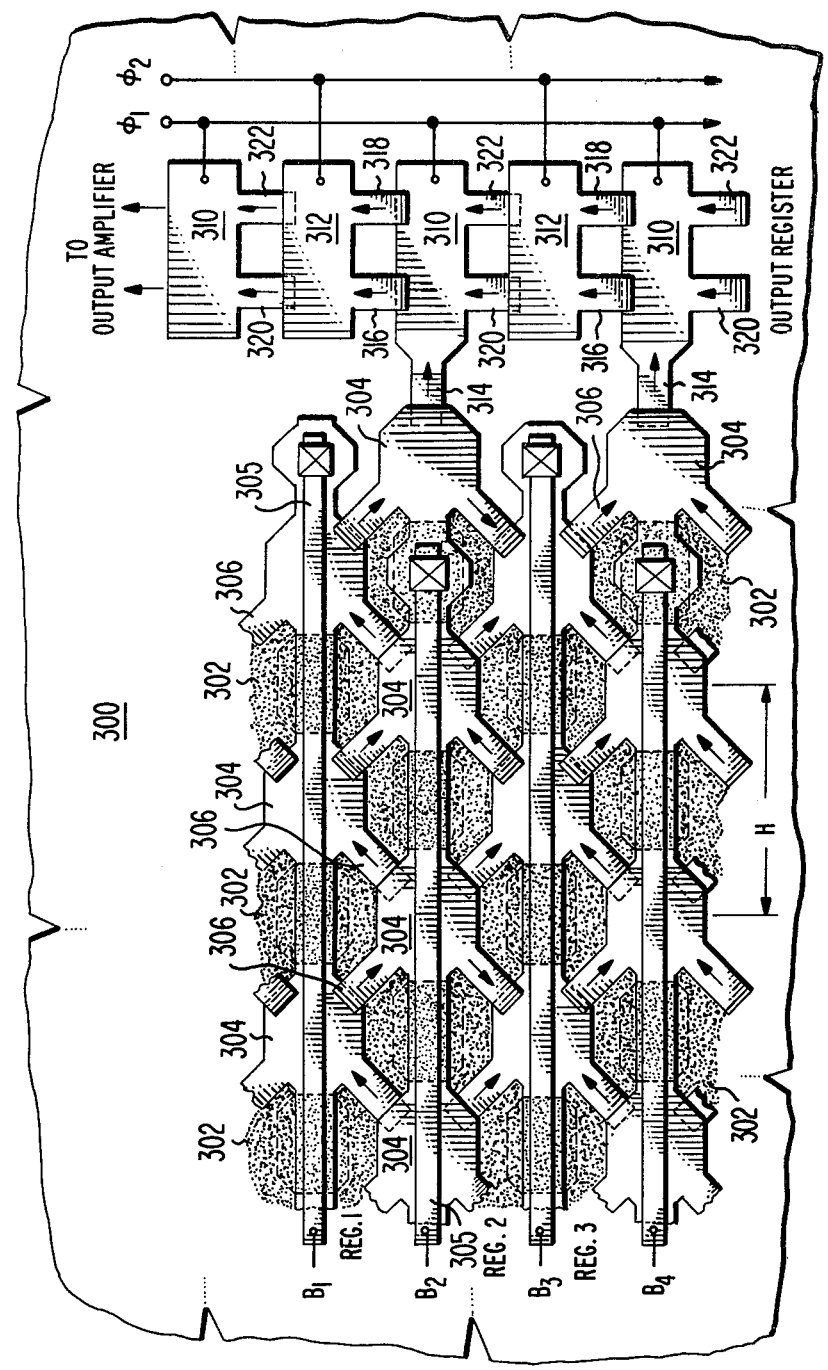
FIG. 3 illustrates a second embodiment of the present invention.
Figure 5:
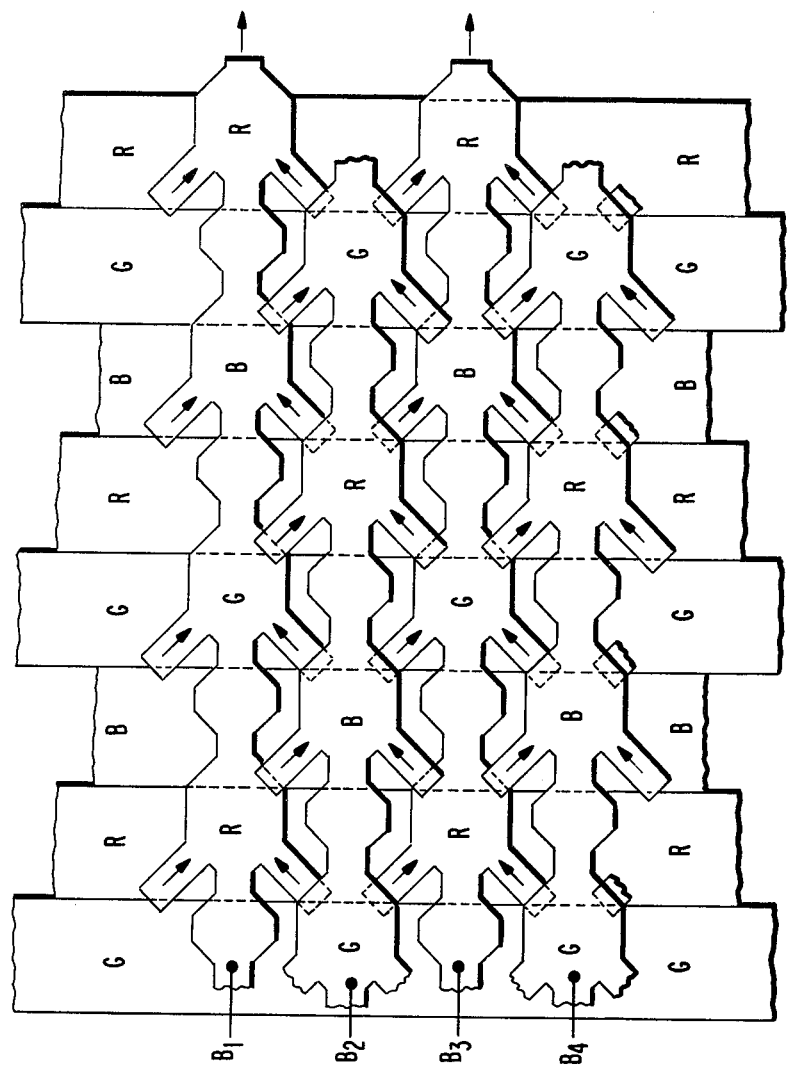
Figure 6:
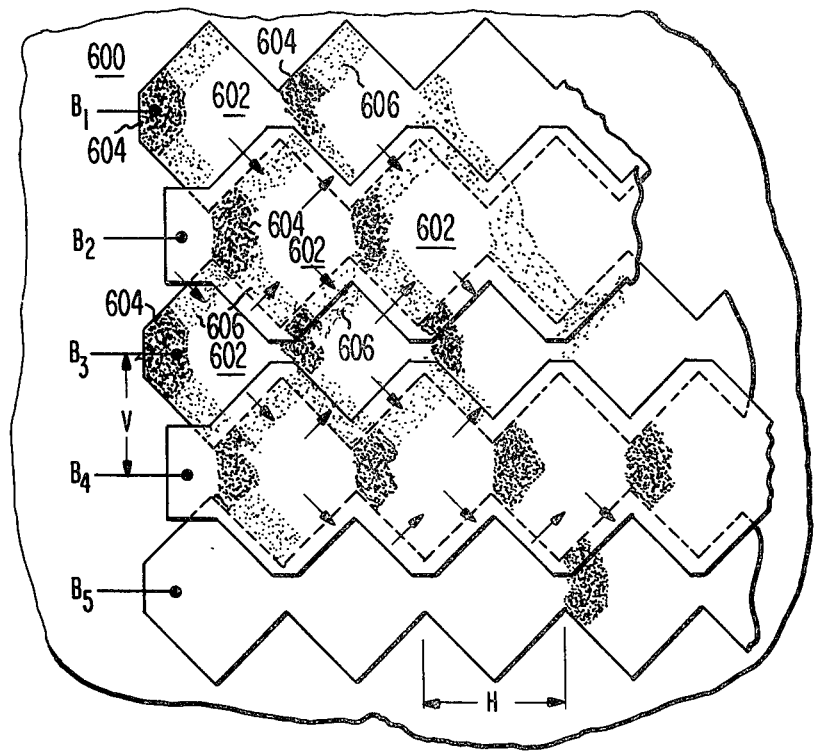
Figure 7:
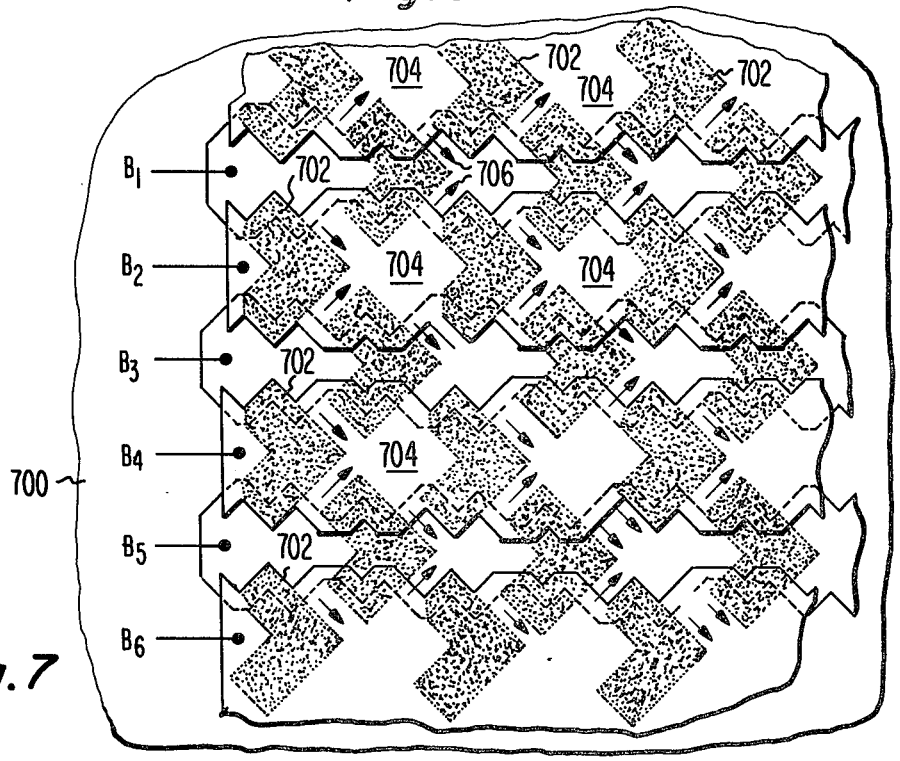
Figure 8:
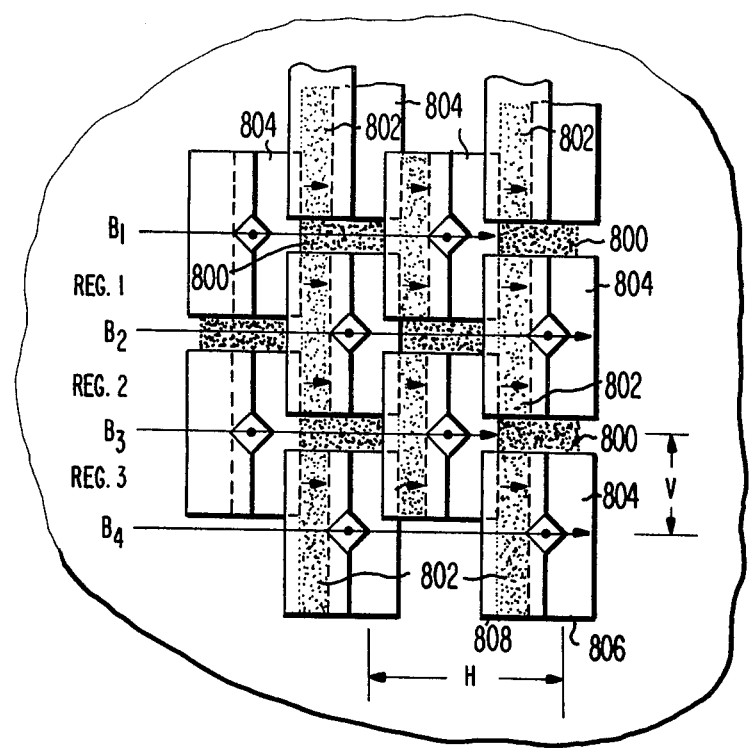

FIGS. 4a and 4b, respectively, illustrate a typical drive circuit arrangement for deriving predetermined control voltage signals which may be employed by the various embodiments of the present invention shown in FIGS. 2, 3, 6, 7 and 8, and timing diagrams for these predetermined control voltage signals;

FIG. 5 illustrates a single-chip color camera stripe-filter layout for the embodiment of FIG. 3;

FIG. 6 illustrates a third embodiment of the present invention;

FIG. 7 illustrates a fourth embodiment of the present invention;

FIG. 8 illustrates a fifth embodiment of the present invention;

FIG. 9 illustrates a sixth embodiment of the present invention, and

FIGS. 9a and 9b are auxiliary diagrams helpful in describing the structural and operational details of the sixth embodiment.

Referring to the prior art structural architecture of the CCD line transfer imager shown in FIG. 1, semiconductor substrate surface 100 of an imager chip includes integrated channel stops 102. As is known in the CCD art, channel stops 102 may comprise regions that operate as potential barriers to charge transfer thereacross. Such regions may be of the same conductivity type as the substrate, but more highly doped than the substrate. Assuming a P-type substrate, the channel stops may be of P++ type. As is shown in FIG. 1, the horizontal portions of channel stops 102 divide the surface of substrate 100 into a plurality of separate, isolated channel registers, such as register (REG) 1, register 2 and register 3.

Channel stops 102 also include vertically protruding stub portions 102a, disposed as shown in FIG. 1, for dividing each register into upper and lower rows of communicating stages. Each stage is comprised of a charge storage region 104 at which, during the integration time, a relatively deep potential well is formed in the substrate, as is known in the CCD art. Further, each stage is comprised of a charge-transfer regions 106, at which, during the integration time, a relatively shallow potential well is formed in the substrate, as is also known in the CCD art. Such a relatively shallow potential well may be produced by employing a suitable P+ ion implant, as shown, in the charge-transfer regions 106 portions of the substrate surface 100.

The imager shown in FIG. 1 further comprises a set of odd gate electrodes and a set of even gate electrodes. The electrodes and the voltages applied thereto are hereafter identified by B followed by a subscript. Thus, for example, $B_1$, $B_3$, $B_5$ . . . refer to odd electrodes and $B_2$, $B_4$, $B_6$ . . . to even electrodes and later in the discussion to voltages applied to the respective electrodes. The odd set of gate electrodes is comprised of a lower-level integrated structure, such as one formed of polysilicon, and the even set of gate electrodes is comprised of an upper-level integrated structure which also may be formed of polysilicon. Each gate electrode of the even set partially overlaps adjacent ones of the odd set of gate electrodes. As is shown in FIG. 1, odd gate electrode $B_1$ is in cooperative spatial relationship with the upper row of charge storage regions of register 1; even gate electrode $B_2$ is in cooperative spatial relationship with both the lower row of charge storage regions of register 1 and the upper row of register 2; odd gate electrode $B_3$ is in cooperative spatial relationship with both the lower row of charge storage regions of register 2 and the upper row of charge storage regions of register 3, etc. Thus, with the exception of the topmost and bottommost gate electrodes, every gate electrode is in cooperative relationship with a pair of adjacent registers.

The operation of the line transfer imager in FIG. 1 is assumed to be compatible with interlaced television, in which each television frame is comprised of successive odd and even fields of television raster scan lines. Each register is operated to transfer charge during only a single scan line of a television frame. During the rest of each frame period, each register accumulates an integrated photoelectrically generated charge in each of the storage regions 104 thereof, in a manner known in the CCD art.

In particular, during the occurrence of the first line of an odd field, register 1 is operated to transfer out the charge that has accumulated in the storage regions of register 1 during the preceding television frame. This is accomplished by applying control voltage signals (such as those discussed in detail in FIGS. 4a and 4b below) to gate electrodes $B_1$ and $B_2$ associated with register 1. The effect is to alternately transfer charge stored in a preceding storage region of the upper row of register 1 to the next storage region of the lower row of register 1 (as indicated by arrow 108) and then transfer charge stored in a preceding storage region of the lower row of register 1 to the next storage region of the upper row of register 1 (as indicated by arrow 110). This process continues until register 1 is empty, at the end of the readout of the first television line. Next, the third television line is read out. This is accomplished by suitable control voltage signals applied to gate electrodes $B_3$ and $B_4$ associated with register 3. Readout of register 3 is identical to that discribed above in connection with register 1, with arrows 112 and 114 indicating the charge-transfer path. During the remainder of an odd field, each successive odd register is read out in turn.

Television line number 2 forms the first television line of an even field. Television line 2 is read out by applying suitable control voltage signals to gate electrodes $B_2$ and $B_3$ associated with register 2. Arrows 116 and 118 indicate the charge-transfer path for reading out register 2. During the remainder of each even field, each successive even register is read out in turn.

One of the desirable features of the prior art configuration shown in FIG. 1 is that, with the exception of the topmost ($B_1$) and the bottommost gate electrodes, the gate electrodes of the prior art configuration shown in FIG. 1 are shared by an adjacent pair of odd and even charge-transfer registers. All of the embodiments of the present invention, described below, (except the sixth embodiment of FIG. 9) retain this desirable feature of sharing gate electrodes.

However, the prior art configuration shown in FIG. 1 also incorporates certain undesirable features. First, the proportion of the entire substrate area taken up by separate upper and lower rows to reach individual register and by continuous channel stops 102 is relatively large. For instance, assuming the horizontal dimension a and the vertical dimension b of either a charge-transfer region or a charge-storage region to have a typical value of 8 $\mu$m, and a channel stop width of about 3 $\mu$m, a typical center-to-center picture element height V is 23 $\mu$m and a typical center-to-center picture element width H is 22 $\mu$m. Thus, the vertical space required for two storage regions and two continuous channel stop regions to separate adjacent registers significantly reduces the number of picture elements per unit area that can be accommodated.

It is known that under intense illumination conditions, CCD images are subject to "blooming" (i.e., the charge generated by one picture element is sufficiently large to overflow from the storage region of that picture element to adjacent storage regions through intervening transfer regions). The presence of continuous channel stops 102 in the prior art configuration of FIG. 1 prevents blooming in the vertical direction from one register to another. However, blooming in the horizontal direction, along the storage regions of any single register, is accordingly increased. The result is that blooming causes an intense "point" spot of illumination in the original scene to be distorted into a relatively long, narrow "line" spot extending in the horizontal direction in the display of a television picture derived from the imager. Such a distortion is quite objectionable because it is particularly noticeable to a viewer. Thus, a second undesirable feature (like the first undesirable feature discussed above) results from the presence of continuous channel stops 102. The present invention overcomes both these undesirable features and gains other advantages by doing away with the need for continuous channel stops.

Comparing the configuration of the first embodiment of the present invention, shown in FIG. 2, with that of the prior art, shown in FIG. 1, substrate 200 corresponds to substrate 100; charge storage regions 204 correspond with charge storage regions 104; charge transfer regions 206 correspond with charge-transfer regions 106 and gate electrodes $B_1$, $B_2$ . . . of FIG. 2 correspond with gate electrodes $B_1$, $B_2$ . . . of FIG. 1. The big difference in the structural configuration of FIG. 2, embodying the present invention, from that of the prior art shown in FIG. 1, resides in the substitution of the periodically-spaced channel-stop islands 202 of each row of the imager of FIG. 2 for the continuous channel stops 102 of FIG. 1. More particularly, channel-stop islands 202, which operate as potential barriers, are positioned along any row with a given center-to-center spacing distance therebetween. Further, the positions of channel-stop islands 202 of even rows are offset with respect to those of odd rows by substantially one-half the aforesaid given center-to-center spacing distance. In this manner, there is formed a two-dimensioned spatial array of charge-storage regions 204, in which the spaced charge-storage regions 204, themselves, form islands that communicate with each other through charge-transfer regions 206. Due to the fact that in FIG. 2 the space between adjacent edges of successive channel-stop islands 202 in any row is divided substantially equally into a transfer region 206 followed by a contiguous storage region 204, the resulting two-dimensional array defines a checker-board spatial distribution pattern of storage regions 204 and transfer regions 206.

In the configuration shown in FIG. 2, register 1 is comprised of rows 1 and 2 (associated with gate electrodes $B_1$ and $B_2$), register 2 is comprised of rows 2 and 3 (associated with gate electrodes $B_2$ and $B_3$), etc. This differs from the prior art configuration of FIG. 1, wherein each individual register is comprised of its own individual upper row and lower row. In other words, in the FIG. 2 configuration, successive registers both share gate electrodes and share rows of storage and transfer regions. In the prior art configuration of FIG. 1, however, successive registers share only gate electrodes. One of the benefits of the configuration of FIG. 2 by virtue of the fact that each pair of adjacent registers have a common row is a reduction in the effective picture element height V from a typical value of 23 $\mu$m in FIG. 1 to a typical value of only 12 $\mu$m in FIG. 2 (where the respective values of the horizontal and vertical dimensions a and b are assumed in both cases to have the typical values of 8 $\mu$m). Although, the width H of a picture element in FIG. 2 remains at the same typical value of 22 $\mu$m as in FIG. 1, the number of picture elements per unit area of the substrate surface that is achievable using the teachings of the present invention, as configured in FIG. 2, is nearly double that achievable using the prior art configuration of FIG. 1.

The problem of "blooming" is also mitigated using the configuration of FIG. 2. More particularly, the use of a two-dimensional array of spaced charge-storage islands that communicate with each other both vertically and horizontally through intervening charge transfer regions, in the configuration of FIG. 2, causes an intense "point" spot of illumination in the original scene to "bloom" into a somewhat larger spot that remains substantially symmetrical in both the horizontal and vertical dimensions. This type of symmetrical distortion, caused by blooming in the configuration of FIG. 2, is much less disturbing to a viewer of a displayed television picture than is the narrow "line" spot type of distortion, discussed above, caused by blooming in the prior art continuous channel stop configuration of FIG. 1.

Referring now to FIG. 3, there is shown a second embodiment of the present invention which possesses other desirable features, in addition to those possessed by the embodiment of FIG. 2. As shown in FIG. 3, substrate 300 also comprises a plurality of rows of periodically-spaced channel-stop islands 302, which operate as potential barriers, with the positions of channel-stop islands 302 of even rows being offset with respect to those of odd rows by substantially one-half the center-to-center spacing distance between channel-stop islands 302. Each of a set of gate electrodes $B_1$, $B_2$, $B_3$, $B_4$... is individually associated with each row. The gate electrode of each odd row may be comprised of a first level of polysilicon and the gate electrode of each even row may be comprised of a second level of polysilicon that partially overlaps the first level, as shown in FIG. 3. The integrated-circuit processing technique for fabricating channel-stop islands 302 comprises the steps of first diffusing or ion implanting the relatively central portion of each channel-stop island 302 (shown in outline) prior to deposition of the polysilicon gate electrodes, and then, after the deposition of both the first and second layers of polysilicon gate electrodes, implanting or diffusing the peripheral remaining portion of each channel-stop island 302, so that the entire island is self-aligned with the gate electrodes.

As indicated in FIG. 3, the gate electrode of each row comprises a plurality of widened sections 304, each of which extends the entire distance between adjacent channel-stop islands of a row. These widened sections 304, each of which has a typical center-to-center spacing along a row of 24 $\mu$m, define separate charge-storage islands on substrate surface 300. A typical vertical dimension for each of widened sections 304 is 12 $\mu$m. The respective widened sections 304 of the polysilicon layer of each row are electrically coupled in parallel, preferably by an overlying aluminum (or other metal) bus 305 which directly or capacitively connects the polysilicon layer of that row to its control signal source. (Although not shown in FIGS. 2, 6, 7, 8 and 9, the polysilicon gates of these embodiments of the present invention may also be supplemented by buses similar to bus 305).

Further, each gate electrode $B_1$, $B_2$... includes a pair of narrow extensions 306 from each widened section 304 thereof. As indicated in FIG. 3, a first of the pair of narrow extensions 306 from each widened section of any gate electrode terminates in overlapping relationship with the preceding neighboring widened section of an adjacent gate electrode on one side thereof, while the second of the pair of narrow extensions 306 from each widened section 304 of each gate electrode terminates an overlapping relationship with the preceding neighboring widened section of an adjacent gate electrode on the other side thereof. In particular, the narrow extensions 306 of each odd gate electrode $B_1$, $B_3$... underlie the preceding neighboring widened section 304 of adjacent (i.e., even) gate electrodes, while the narrow extensions to 306 of even gate electrodes $B_2$, $B_4$... overlie the preceding neighboring widened sections 304 of adjacent (i.e., odd) gate electrodes. A narrow extension (such as extension 306) which has a typical width of 3 $\mu$m, defines a charge transfer region, which couples the storage regions in each register. By making the charge transfer regions very narrow, as is known in the prior art [See Y. Daimon-Hagiwara "Two Phase CCD with Narrow-Channel Transfer Regions", Jap. Jour. of Appl. Phys., Vol. 17 (1978) Supplement 17-1 pp. 255-261, and Y. Daimon-Hagiwara, M. Abe, and C. Okada, "A 380H×488V CCD Imager, with Narrow Channel Transfer Gates" Jap. Jour. of Appl. Phys. Vol. 18 (1979) Supplement 18-1 pp. 335-340.], a transfer barrier, required to give directionality to any two-phase CCD register, is automatically produced. Thereby, during odd fields, gate electrodes $B_1$ and $B_2$ define a channel register for the first television line, gate electrodes $B_3$ and $B_4$ define a channel register for the third television line, etc. However, during even fields, gate electrodes $B_2$ and $B_3$ define a channel register for the second television line, gate electrodes $B_4$ and $B_5$ (not shown) define a channel register (not shown) for the fourth television line, etc.

The configuration of FIG. 3 is similar to that described above in connection with FIG. 2 to the extent that the substrate surface is divided into a predetermined two-dimensional array of spaced charge-storage islands that communicate with each other through charge-transfer regions. Therefore, the configuration of FIG. 3 exhibits both of the aforesaid desirable features (higher packing density of picture elements and less-objectionable distortion due to blooming) discussed above in connection with FIG. 2. Further, the configuration of FIG. 3 exhibits additional desirable features. Among these additional desirable features are the following:

1. The blue sensitivity when illuminated from the gate side is substantially increased because of the relatively large portion of each picture element area which is not covered by the polysilicon gates, since polysilicon is an absorbent of blue light.
2. The narrow transfer gates require relatively little overlap between adjacent gates, thus reducing the problems of driving the row buses at horizontal clock rates of 7–10 MHz.
3. Fabrication is relatively simple, since no self-aligned transfer barriers are required under each gate.

Although not essential to the invention itself, FIG. 3 also shows how the imager may be associated with an output register situated on the same chip. As shown in FIG. 3, the output register comprises a first set of charge storage stages 310, each of which is associated with a different one of the even rows of the imager, and a second set of charge storage stages 312 situated between successive first-set stages 310. Each of the even-row gate electrodes and each of the second-set stages 312 is comprised of an upper-level of polysilicon, while each of the odd-row gate electrodes and each of the first-set stages 310 is comprised of a lower-level of polysilicon. Narrow extensions 314, underlying the last widened section 304 of each even gate electrode, operate as charge-transfer regions coupling respective ones of the first set of stages 310 to the corresponding even gate electrodes of the imager. Each second set stage 312 includes two separate narrow extensions 316 and 318, overlying the preceding first-step stage 310, which operate as charge-transfer regions therebetween. Similarly, each first-set stage 310 includes extensions 320 and 322 underlying the preceding second-set stage 312, which operate as charge-transfer regions therebetween. The use of a pair of narrow extensions 316 and 318, operating in parallel, and a pair of narrow extensions 320 and 322, operating in parallel, is desirable (but not essential) because it permits faster charge-transfer to be achieved in reading out the output register.

Referring now to FIGS. 4a and 4b, there is shown in FIG. 4a a functional block diagram of the imager, output register and clock drive circuits therefor, while there is shown in FIG. 4b timing diagrams of the respective clock signals employed in FIG. 4a. The clock drive circuits in FIG. 4a are basically similar to clock drive circuit shown in greater detail in my aforesaid copending patent application Ser. No. 5,073.

As is shown in FIG. 4a, vertical scan generator and row selector circuits 400 receive as separate inputs respective vertical clocks $V_1$, $V_2$ and $S_T$ and respective odd field (O.F.) and even field (E.F.) clocks. As shown in FIG. 4b, vertical clock $V_1$ is a square wave signal occurring at one-half the line frequency (e.g., 7,875 H, with vertical clock $V_1$ being high during each odd line and being low during each even line of a frame and vertical clock $V_2$ being high during each even line and being low during each odd line of a frame.) Vertical clock $S_T$ (start) is high during line 1 of an odd field and line 0 of an even field of a frame. The O.F. and the E.F. clock signals are square waves that occur at the field frequency (e.g., 60 H), with the O.F. clock being high during odd fields and low during even fields and the E.F. clock being high during even fields and low during odd fields.

The vertical scan generator portion of block 400, in response to the input clocks thereto, divides each successive field into 250 sequential signals which are selectively forwarded to the odd ones of outputs $S_1 \ldots S_{500}$ during odd fields and the even ones of outputs $S_1 \ldots S_{500}$ during even fields. Specifically, each odd one of outputs $S_1 \ldots S_{500}$ is rendered high only during the occurrence of a correspondingly numbered line of an odd field (and low at all other times of an odd field), while each even one of the outputs $S_1 \ldots S_{500}$ is rendered high only during the occurrence of the immediately preceding odd line of an odd field. In a similar manner, during each even field, each even one of outputs $S_1 \ldots S_{500}$ is rendered high only during the occurrence of a correspondingly numbered line, while each odd one of outputs $S_1 \ldots S_{500}$ is rendered high during the occurrence of the immediately preceding even line of an even field.

Outputs $S_1 \ldots S_{500}$ are applied as row selection inputs to row-bus clock drive circuits 402. In addition, horizontal clocks $H_1 \ldots H_2$ are applied as inputs to block 402. As indicated in FIG. 4b, respective clocks $H_1$ and $H_2$ are square waves having the same relatively high frequency, but being out of phase with respect to each other. Therefore, clock $H_1$ is high when clock $H_2$ is low and vice versa. The frequency of clocks $H_1$ and $H_2$ determines the line transfer readout rate of the imager. Block 402, during the selection of each odd row, in turn, of an odd field by the then-high ones of row selection inputs $S_1 \ldots S_{500}$, forwards clock $H_1$ to the successive odd ones of serially-selected rows $B_1 \ldots B_{500}$ and forwards clock $H_2$ to the successive even ones of serially selected rows $B_1 \ldots B_{500}$. In a similar manner, during even fields, clock $H_1$ forwarded to even ones of the serially-selected rows $B_1 \ldots B_{500}$ and clock $H_2$ is forwarded to successive odd ones of the serially selected rows $B_1 \ldots B_{500}$. The respective outputs from block 402 are connected to the respective gate electrodes of rows $B_1 \ldots B_{500}$ of the imager. Assuming the imager to be the one shown in FIG. 3, boxes 404 correspond with the charge-storage islands defined by wide sections 304. The odd arrows 406 show the path of charge-transfer for register one (corresponding to television line 1) resulting from the application of horizontal clocks $H_1$ and $H_2$ to gate electrodes $B_1$ and $B_2$ (during an odd field). Arrows 408, 410 and 412 correspond respectively to the path of charge-transfer for register 2 (during an even field), register 3 (during an odd field) and register 4 (during an even field), in response to the $H_1$ and $H_2$ clocks being applied to appropriate one of gate electrodes $B_2$, $B_3$, $B_4$ and $B_5$ in the manner described above.

Clocks $\phi_1$ and $\phi_2$, which may have the same frequency as clocks $H_1$ and $H_2$ and which are out of phase with each other, are applied respectively to first-set stages 414 and second-set stages 416 (which correspond respectively to stages 310 and 312 of FIG. 3). The output register, in response to clock voltages $\phi_1$ and $\phi_2$, reads out the imager, that is, it propagates each line of charge signals to an output terminal, not shown where the charge packets are translated to voltages, and these voltages are applied to a video output amplifier (not shown) which produces the video signals employed for full vertical interlace. As described in the aforesaid co-pending patent application 5,073, the progressive video delay in successive lines introduced by the output register can be compensated for by modification of the vertical clock rate or, alternatively, by use of a special variable delay register in the subsequent video circuits. Also, the output register shown in FIGS. 3 and 4a may be replaced, in an alternative readout system, by a column of outputs diodes coupled to alternate row gate electrodes in a manner shown and described in my aforesaid co-pending patent application 5,073. These output diodes normally are connected to a sensitive video amplifier which might be integrated on the same chip. Although this output diode readout system offers no signal delay problems, it does not yield quite as high a signal-to-noise ratio as the output register shown in FIGS. 3 and 4a.

In the operation of an imager, in the manner shown in FIGS. 4a and 4b, whenever a given register is activated by application of horizontal voltages $H_1$ and $H_2$ to the gate electrodes defining that particular register, the neighboring gate electrodes are maintained at zero voltage, or substrate potential. In this way a potential barrier is formed at either side of the then active register, which confines the charge to that particular register during readout thereof.

The effect of the 60 cycle odd field (O.F.) and even field (E.F.) clocks is to maintain alternate rows either high or at ground during the entire line period prior to the readout of each line. In this way, a checkerboard pattern of storage-island potential wells is provided over the entire array in which photo-generated charge carriers collect during the charge integration period. The storage-island potential wells are formed under the high voltage gate while the grounded gates provide barriers to separate the wells. If desired, the grounded gates can actually be driven slightly negative to provide anti-blooming "accumulation barriers" to suppress excess charge from brightly illuminated areas of images having a surface channel CCD, rather than a buried channel CCD.

Although various circuits and technologies can be used to produce the required waveforms shown in FIG. 4b, MOS circuitry is relatively compatible with the fabrication of a CCD imager of any of the configurations shown in FIGS. 2 and 3, described above, and FIGS. 6, 7, 8 and 9, to be described below. Although the output register is not shown on the chip of each of these other embodiments, it should be understood that an output register similar to that shown in FIG. 3 could be used with each of these other embodiments.

Referring to FIG. 5, there is shown a combination of an imager having the configuration of FIG. 3 with a color-stripe filter for use in a single-chip CCD color television camera. As shown, each green (G), red (R) and blue (B) color stripe is oriented substantially perpendicular to the row direction of the imager. Further, the width of each color stripe is substantially equal to one-half of a picture element stage of a register.

The arrangement shown in FIG. 5 results in the occurrence of a certain amount of undesirable color contamination in the output signal derived from the imager. In particular, during each odd field sequence, all odd lines derive color sequence (R+g), (B+r), (G+b), (R+g), etc. (where lower-case letters are used to identify the substantially weaker contaminating color portion). During even fields, each even line derives the color sequence (G+b), (R+g), (B+r), (G+b), etc. For a more detailed discussion of color-stripe CCD color cameras, reference should be made to my aforesaid co-pending application 5,073. It should be understood that the color-stripe filter could, alternatively, employ subtractive primary color stripes (i.e., cyan, magenta and yellow), rather than the additive-primary color stripes (green, red and blue) shown in FIG. 5. In either case, the color purity can be restored by low pass filtering and electronic matrixing of the color signals derived from the imager by methods known in the art.

In the respective configurations of the present invention shown in FIGS. 2 and 3, the vertical picture element spacing is reduced to substantially one-half that required by the prior art, but the horizontal picture element spacing is substantially unaffected. FIG. 6 shows a configuration of the present invention in which both the vertical and horizontal picture-elements spacings are reduced. In particular, substrate surface 600 is divided into an array of charge-storage islands 602 that are defined by (1) rows of periodically-spaced hexagonal-shaped channel-stop islands 604 (which operate as potential barriers) and (2) implanted charge-transfer regions 606. More specifically, as shown in FIG. 6, the first of three pairs of parallel sides of each charge-storage islands 602 is defined by adjacent edges of successive channel-stop islands 604 in a row, and each of the four sides comprising a second and third of the three pairs of parallel sides of a charge-storage island 602 are defined by the edge of an individual transfer region positioned to provide communication therethrough between that storage island and a separate one of its first and second neighboring storage islands of adjacent rows on either side thereof. Further, as shown in FIG. 6, the channel-stop islands 604 of even rows are offset with respect to those of odd rows by substantially one-half the periodic spacing distance between channel-stop islands 604. The gate electrodes $B_1, B_2, B_3, B_4, B_5$... are individually associated with correspondingly numbered rows in the configuration shown in FIG. 6. More specifically, the respective gate electrodes of the odd rows and of the even rows are disposed in overlapping relationship with each other. Further, the gate electrodes have a given shape which is defined by (1) a first pair of opposite gate electrode edges disposed substantially parallel to the aforesaid second pair of sides of the hexagonal shape of each charge-storage island 604 and by (2) a second pair of opposite gate electrode edges disposed substantially parallel to the aforesaid third pair of sides of the hexagonal shape of each storage island 602. In the arrangement in FIG. 6 the horizontal picture element spacing distance H has a typical value of 17 $\mu$m and the vertical picture element spacing distance V has a typical value of 14 $\mu$m. The configuration of FIG. 6 provides a relatively direct coupling between charge-storage islands 602, (i.e., a charge-transfer region 606 having a relatively short length and a relatively wide width). This reduces somewhat the transfer losses at higher frequencies.

In both the configurations shown in FIG. 2 and FIG. 6, which employ implanted charge-transfer regions, each implanted region must be carefully aligned with the entrance edge of each charge-storage island in order to avoid unwanted potential wells or potential barriers which would decrease transfer efficiency. However, methods of aligning implanted charge-transfer regions with each edge of the polysilicon gate electrodes, such as the "offset gate" process, are well known and are applicable here. Diffused channel-stop island 604 are non-critical and can be diffused prior to polysilicon deposition in a conventional matter.

Referring to FIG. 7, there is shown an alternate method of constructing a line scan imager with shared storage islands and narrow charge-transfer regions by defining the narrow transfer regions by the initial channel stop diffusion rather than by the narrow gate projections as was done in FIG. 3. More specifically, channel-stop islands 702 are periodically spaced along a row and are offset by one-half the periodic spacing between odd and even rows. Channel-stops islands 702 are L-shaped and are oriented at an oblique angle with respect to the row direction, as shown in FIG. 7. As indicated, channel-stop islands 702 divide each row into rectangular shaped charge-storage islands 704, each of which storage islands communicates with a neighboring storage island of both respective adjacent rows on either side thereof through narrow charge-transfer regions 706 (as indicated by the arrows). The odd gate electrodes $B_1$, $B_3$, $B_5$ . . . are comprised of a first level of polysilicon having the complex shape shown in FIG. 7. The even gate electrodes $B_2$, $B_4$, $B_6$. . . are comprised of a second level of polysilicon having the complex shape shown in FIG. 7. As indicated in FIG. 7, the respective gate electrodes of odd rows and even rows are disposed in overlapping relationship with respect to each other.

FIG. 7 illustrates the first instance in which the narrow transfer gate dimensions are determined by the channel-stop islands 704 which are defined prior to the polysilicon gate deposition. The advantage here is that the dimensions of the channel-stop islands can be more accurately controlled than can the dimensions of the polysilicon gates, which require etching and pattern delineation on non-planar surfaces.

The location of the polysilicon gates in this structure is completely uncritical at all points except where the first polysilicon gate coincides with the entrance end of the narrow transfer charge-transfer slot. If the edge of the first polysilicon gate were to be displaced by an appreciable distance down the channel slots, an unwanted potential barrier would be formed at the exit edge of the preceding storage region. This would trap charge and degrade charge-transfer efficiency. On the other hand, if the edge of the first polysilicon gate were to be displaced in the opposite direction (toward and preceding storage region), the additional potential barrier placed in series with the normal transfer region potential barrier of the following stage would always be higher than the normal transfer region potential barrier (as long as the misregistry is less than the width of the narrow charge-transfer region potential barrier), thus having no bad effect on transfer efficiency. It is, therefore, desirable to design the edge of the first polysilicon to fall slightly within the preceding storage region, as shown, to ensure that misalignment errors do not carry it into the charge-transfer region narrow slot. The second polysilicon gate is completely non-critical, since if overlaps the first polysilicon layer or a channel-stop island at all points. Thus, in FIG. 7 channel-stop islands 704 of a row are shaped to divide the row into diamond-shaped storage islands, each of which communicates with two neighboring storage islands of an adjacent row on one side thereof through two narrow transfer regions and communicates with two neighboring storage islands of an adjacent row on the other side thereof through two narrow transfer regions.

Referring to FIG. 8, there is shown an embodiment of the present invention which employs a somewhat different type of layout than the embodiments shown in FIGS. 2, 3, 6 and 7. In particular, channel-stop islands 800 have a substantially rectangular shape, with this rectangular shape having a given length in the row direction which is less than the center-to-center spacing distance between successive channel-stop islands 800 in a row. Each of transfer regions 802 of a row also has a substantially rectangular shape. However, the transfer-region rectangular shape has a length in the row direction which is small relative to the length of a channel stop island and has a height in a direction perpendicular to the row direction that extends the entire distance between respective channel stop islands of adjacent rows on either side of the row that contains any particular transfer region 802. Further, the leading edge of each transfer region 802 is substantially aligned with the leading edges of the respective channel stop islands of adjacent rows on either side of the row containing that transfer region 802. In FIG. 8, each charge-storage island 804 is defined by the particular channel-stop islands 800 and charge-transfer regions 802 surrounding that particular storage island 804. As is well known in the CCD art the implanted transfer barrier in region 802 can be self-aligned with the leading edge of the gate electrodes by carrying out the implantation subsequent to the deposition of the first polysilicon gate electrodes and prior to deposition of the second polysilicon gates.

Each of gate electrodes $B_1$, $B_2$, $B_3$, $B_4$. . . , in FIG. 8, is comprised of a plurality of rectangular-shape sections each pair of which is associated with the space between successive channel stop islands 800 of a row. The combined length of the pair of overlapping first and second polysilicon gate electrodes for each stage of the register in the row direction is substantially equal to the entire spacing distance between successive channel-stop islands 800 of a row and has a height in the direction perpendicular to the row direction equal to the entire spacing distance between channel-stop island 800 of adjacent rows on either side of the row which that gate electrode is associated. In the arrangement shown in FIG. 8, each section of a gate electrode is comprised of lower polysilicon level 806 and an upper polysilicon level 808 which overlaps lower level 806, as shown in FIG. 8. The upper and lower levels 806 and 808 of all the sections of gate electrode associated with each individual row are electrically interconnected, (either directly or capacitively) as is indicated in FIG. 8.

A typical vertical dimension V of a picture element in FIG. 8 is 12 $\mu$m and a typical horizontal dimension H of a picture element in FIG. 8 is 24 $\mu$m. As indicated by the arrows in FIG. 8, charge-transfer is in a direction parallel to the rows. This direction of transfer is to be contrasted with the other examples given in which charge-transfer between storage islands occurs at an angle to the direction of the rows. For example, in the present case, during the occurrence of an odd field, the application of control signals to electrodes $B_1$ and $B_2$ first result in charge-transfer from each storage island 804 of row $B_1$ to the next succeeding storage island 804 of row $B_2$ through the intervening transfer region 802, and then result in a charge-transfer from each storage island 804 of row $B_2$ to the next succeeding storage island 804 of row $B_1$ through the intervening transfer region 802. In a similar manner, during the occurrence of an even field, the application of control signals to gate electrodes $B_2$ and $B_3$ first result in the charge-transfer from each storage island 804 of row $B_2$ to the next succeeding storage island 804 of row $B_3$ through the intervening transfer region 802, and then result in the charge-transfer back from each storage island of row $B_3$ to the next succeeding storage island 804 of row $B_2$ through the intervening transfer region 802.

A recently developed technique for selectively doping the substrate of a CCD buried-channel imager permits only a single gate electrode and single clock signal to be required for each stage [J. Hyncek, "Virtual Phase CCD Technology", Technical Digest, page 611, International Electron Devices Meeting, Washington, DC, Dec. 3-5, 1979 (Texas Instruments).] Each stage is comprised of a clocked phase and a "virtual phase" whose potential is determined entirely by the doping levels. FIG. 9 illustrates an embodiment of the present invention which takes advantage of this recently developed technique. A cross-section of the substrate dopings required is shown in diagrammatic form in FIG. 9a.

Although not shown in FIG. 9a, silicon substrate 900 is uniformly doped to provide buried-channel operation, in a manner known in the art. In addition, each of successive picture element stages is divided into four selectively doped sections, numbered 1, 2, 3 and 4 in that order, as shown in FIG. 9a. Other than the uniform buried-channel doping, section 1 is not further doped. Section 2 is created by a shallow N-type implant therewithin (as is indicated by the + sign). Section 3 is formed by a deeper N-type implant (as indicated by the + sign) topped at the surface by a shallow P-type implant (indicated by the − sign). Section 4 is formed by an even deeper and heavier N-type implant (as indicated by the + sign) topped at the surface by a shallow P-type implant (as indicated by the − sign).

The top surface of substrate 900 is covered with a layer of silicon dioxide 902. Situated on the top of silicon dioxide layer 902, in cooperative spatial relationship with only Sections 1 and 2 of each picture element stage, is a clocked-phased gate electrode 904. The surface of substrate 900 in cooperative spatial relationship with Sections 3 and 4 of each picture element stage constitutes a virtual-phase portion of that stage, which does not require any gate electrode.

Section 1 constitutes a lightly doped region that operates as a clocked-phase charge-transfer region; Section 2 constitutes a potential well that operates as a clocked-phase charge-storage region; Section 3 constitutes a more heavily doped region that operates as a fixed-potential virtual-phase charge-transfer region, and Section 4 constitutes a potential well that operates as a fixed-potential virtual-phase storage region. The effect of the shallow P-doping (indicated by − sign) underlying the surface of Sections 3 and 4 of the virtual-phase portion of each picture element stage, is to cause the surface potential of the virtual-phase portion of a stage to be pinned at zero potential regardless of the potential applied to gate electrode 904 of the clocked-phase portion of that stage. This pinning action permits a "virtual-phase" single gate per stage CCD (such as the CCD shown in FIG. 9a) to be operated in the same manner as a two-phase off-set gate CCD in which one phase is held at a fixed-potential. In the case, the virtual-phase portion of a stage is effectively biased to a certain fixed DC potential, while the clocked-phase portion of a stage is clocked to potentials above and below this fixed potential by the clock voltage control signal applied to gate electrode 904.

The embodiment shown in FIG. 9 applies the present invention to the "virtual-phase" approach of FIG. 9a (which is, per se, known in the art), with certain attendent advantages. Among these attendent advantages are a simplification of the drive circuits required for horizontal transfer, and a simplier imager layout with more separated polysilicon gate electrodes. This separation has the effect of reducing the possibility of short circuits between gate electrodes, and also of exposing a larger portion of the semiconductor surface to direct illumination from the gate electrode side (i.e., less of the imager area is covered by blue-light absorbing polysilicon).

The structure in FIG. 9 includes a two-dimensional array of channel-stop islands 906 which is substantially identical to the array of channel-stop islands 202 of the embodiment of the present invention shown in FIG. 2. More specifically, channel-stop islands 906 are disposed periodically at a given center-to-center spacing distance in rows, with the channel-stop islands of odd and even rows being offset from each other by substantially one-half this center-to-center spacing distance. However, in the embodiment shown in FIG. 9, only alternate ones of the rows have polysilicon gate electrodes (e.g., gate electrodes $B_0$, $B_1$, $B_2$, $B_3$, ... $B_{500}$) associated therewith. As indicated by the numerals 1 and 2 in FIG. 9, the surface of substrate 908 between each pair of successive channel-stops 906 of the aforesaid alternate rows is divided into charge-transfer regions having the selected doping of Section 1 of FIG. 9a and charge-storage islands having the selected doping of Section 2 of FIG. 9a. Further, as is indicated by the numerals 3 and 4 in FIG. 9, the surface of substrate 908 between each pair of successive channel-stop islands 906 of the remaining rows is divided into charge-transfer regions having the selected doping of Section 3 in FIG. 9a and charge-storage islands having the doping of Section 4 in FIG. 9a.

The driving circuitry for the gate electrodes comprises vertical clock 910 producing clock signals $V_1$ and $V_2$ having the waveforms shown in FIG. 9b. These vertical clocks are applied to 250-tap vertical scan generator 912, which selectively derives such signals as $S_{12}$, $S_{34}$, etc., having the waveforms shown in FIG. 9b. Signal $S_{12}$ is effective in enabling transistors associated with gate electrodes $B_1$ or $B_2$ only during the occurrence of each of lines 1 or 2 of the odd or even television fields. In a similar manner, signal $S_{34}$ is effective enabling transistors 914 associated with gate electrodes $B_3$ or $B_4$ only during lines 3 or 4 of each respective field frame. Respective clocks $H_1$ odd, and $H_1$ even, having the waveforms shown in FIG. 9b, are respectively applied to each of the odd and even gate electrodes through successively enabled ones of the aforesaid transistors during successively occurring odd and even fields of a television frame.

As shown in FIG. 9b, each of gate electrodes $B_1$, $B_2$, $B_3$, $B_4$ ... have a quiescent given negative potential, which is raised to a given positive potential during the occurrence of each $H_1$ odd or $H_1$ even clock selectively applied thereto. However, gate electrode $B_0$ is maintained at all times at a given negative potential, since it simply provides a suitable upper boundary for operation of the top register.

In the absence of the application of a clock control signal to a gate electrode during the illumination integration period, the potential well of each Section 4 is deepest of all four sections. Therefore, during this integration period, charge carriers are collected in the potential wells of the virtual-phase charge-storage islands comprised of Section 4. However, when any single one of the gate electrodes $B_1$, $B_2$, $B_3$, $B_4$ ... of a clocked phase row is driven positive, charge carriers are drawn from the Section 4 storage-islands of the two virtual-phase rows adjacent thereto to the Section 2 clocked-phase storage islands through the intervening clocked phase charge-transfer regions 1 under that single one of the gate electrodes. As that single one of the gate electrodes continues to be driven above and below the potential of the adjacent virtual-phase rows, the charge packets progress down the row while shifting back and forth between the driven clocked phase Section 2 storage islands and the Section 4 virtual-phase storage-islands on either side thereof, as indicated by the arrows in FIG. 9. Further, as indicated in FIG. 9, the charge-transfer register for television line 1 comprises clocked phase row $B_1$ and the two virtual-phase rows on either side thereof; the charge-transfer register for television line 2 comprises the clocked-phase row $B_2$ and the virtual-phase rows on either side thereof, etc. Therefore, all the potential wells (Sections 3 and 4) of virtual-phase rows are shared between adjacent registers. Thus, vertical interlacing is obtained in a similar manner (but with a slightly greater degree of overlap of successive lines) to the case for the embodiment shown in FIG. 2.

The peripheral integrated circuitry for multiplexing the horizontal clock drive of each row is somewhat simplier in the arrangement of FIG. 9 than it is for a conventional two-phase imager, since the gate electrode of only a single row (when selected) needs to be driven at a time and the respective other gate electrodes need not be held at high or low potential between scans. As before, a 250-tap vertical scan generator is adequate for gating of a 500 line interlaced imager, but the row selector and driver circuits are simplified.

What is claimed is:

1. A charge-transfer imager of the line transfer type comprising;
   a substrate,
   means for dividing said substrate into a predetermined two-dimensional array of spaced charge-storage islands that communicate with one another through charge-transfer regions, said array defining a substantially uniform spatial distribution pattern of said storage islands and transfer regions,
   wherein said storage islands are arranged in n spaced rows numbered 1, 2 ... (n−1), n, with each row comprised of a plurality of spaced islands and with each island of each row being coupled through respective individual transfer regions to each of first and second neighboring islands of an adjacent row on one side thereof and also to each of first and second islands of an adjacent row on the other side thereof, and
   means for applying predetermined control voltages to any selected row and to at least one of the rows adjacent thereto, said predetermined control voltages having certain values relative to each other as a given periodic function of time such that said selected row and the row or rows adjacent thereto to which such predetermined control voltages are applied form a charge-transfer register for a separate line of picture elements in which said picture elements of that separate line are transferred in a given direction along that charge-transfer register from storage island to adjacent storage island thereof at a rate determined by said given periodic function of time.

2. The imager defined in claim 1,
   wherein said means for dividing comprises a set of separate spaced potential barriers having given locations on the surface of said substrate in accordance with said two-dimensional array for defining said spatial distribution pattern.

3. The imager defined in claim 2,
   wherein each of said potential barriers is comprised of a channel stop in said substrate.

4. The imager defined in claim 3, wherein each of said charge transfer regions is comprised of ion implants in said substrate.

5. The imager defined in claim 3, wherein each of said charge-transfer regions is substantially narrower than either of the charge-storage regions connected to it.

6. The imager defined in claim 2, wherein said predetermined array is such that:
   there is a given center-to-center spacing distance between successive potential barriers in a row, and
   the positions of the potential barriers of even rows are offset with respect to those of odd rows by substantially one-half the given center-to-center spacing distance.

7. The imager defined in claim 6,
   further comprising a set of n given-shaped gate electrodes each extending in said row direction, each individual gate electrode being positioned in cooperative spatial relationship with a different one of said rows, wherein each charge-transfer register comprises a selected pair of adjacent rows, and wherein said application of predetermined control voltages is made to said selected pair of adjacent rows through the adjacent pair of gate electrodes corresponding to that selected adjacent row pair.

8. The imager defined in claim 7,
   wherein said predetermined array is such that the space between adjacent edges of successive potential barriers in any row is divided substantially equally into a transfer region followed by a contiguous storage island; thereby to produce a checkerboard spatial distribution pattern of storage islands and transfer regions.

9. The imager defined in claim 8,
   wherein the respective gate electrodes of said odd rows and of said even rows are in overlapping relationship with each other.

10. The imager defined in claim 7,
    wherein each gate electrode includes a plurality of spaced predetermined widened sections each of which is disposed intermediate said potential barriers of the row corresponding to that gate electrode, each of said widened sections defining a separate storage island, and
    wherein each gate electrode also includes a separate first narrow extension from each widened section of that gate electrode which terminates in overlapping relationship with said first neighboring island thereto of an adjacent row on one side thereof and a separate second narrow extension from each widened section of that gate electrode which terminates in overlapping relationship with said first neighboring island thereto of an adjacent row on the other side thereof, each of said narrow extensions defining a transfer region.

11. The imager defined in claim 7, wherein said predetermined array is such that:

each storage island has a hexagonal shape comprised of three pairs of parallel sides,
a first of said three pairs of parallel sides being defined by adjacent edges of successive potential barriers in a row, and
each of the four sides comprising a second and a third of said three pairs of parallel sides being defined by the edge of an individual transfer region positioned to provide communication therethrough between that storage island and a separate one of its first and second neighboring storage islands of adjacent rows on either side thereof.

12. The imager defined in claim 11, wherein the respective gate electrodes of said odd rows and of said even rows are in overlapping relationship with each other, and wherein the given-shape of said gate electrodes is defined by a first pair of opposite electrode edges substantially parallel to said second pair of sides of said hexagonal shape and by a second pair of opposite electrode edges substantially parallel to said third pair of sides of said hexagonal shape.

13. The imager defined in claim 7,
wherein said potential barriers of a row are shaped to divide said row into rectangular-shape storage islands each of which communicates with respective ones of two neighboring storage islands of an adjacent row on one side thereof through respective ones of two narrow transfer regions and communicates with respective ones of two neighboring storage island of an adjacent row on the other side thereof through respective ones of two narrow transfer region, and
wherein the respective gate electrodes of said odd rows and said even rows are in overlapping relationship.

14. The imager defined in claim 7, wherein said predetermined array is such that:
each of said potential barriers has a substantially rectangular shape, said potential-barrier rectangular shape having a given length in said row direction which is less than said center-to-center spacing distance between successive potential barriers in a row,
each of said transfer regions of a row having a substantially rectangular shape, said transfer-region rectangular shape having a length in said row direction which is small relative to said given length and having a height in a direction perpendicular to said row direction that extends the entire distance between respective potential barriers of adjacent rows on either side of said first-mentioned row, with the leading edge of each transfer region being substantially aligned with the leading edges of said respective potential barriers of adjacent rows on either side of said first-mentioned row, and
each storage island being defined by the potential barriers and charge-transfer regions surrounding that island.

15. The imager defined in claim 14,
wherein each gate electrode is comprised of a plurality of rectangular-shaped sections each of which is associated with the space between successive potential barriers of a row, each section having a length in said row direction substantially equal to the entire spacing distance between successive potential barriers of a row and having a height in a direction perpendicular to said row direction equal to the entire spacing distance between potential barriers of adjacent rows to said first-mentioned row on either side thereof.

16. The imager defined in claim 15,
wherein each section of a gate electrode is comprised of first and second overlapping layers, and
wherein the first layer of each section of a gate electrode of a row is in overlapping relationship with the second layer of first and second neighboring sections thereto of each of the gate electrodes of adjacent rows on either side of the gate electrode of said first-mentioned row.

17. The imager defined in claim 6,
further comprising a set of gate electrodes, each extending in said row direction, which are positioned in cooperative spatial relationship with only alternate ones of said n rows,
said substrate being doped to provide buried channel charge-transfer and beinng further selectively doped to provide, in the absence of control voltages to said gate electrodes, potential wells of different depths for said charge-storage islands of said alternate ones and the remaining ones of said n rows and for said charge-transfer regions of said alternate ones and the remaining ones of said n rows, such that (1) the potential well of a storage island of an alternate row is deeper than a transfer region thereof, (2) the potential well of a transfer region of a remaining row is deeper than a storage island of an alternate row, and (3) the potential well of a storage island of a remaining row is deeper than a transfer region thereof, and
wherein only any of said alternate ones of said n rows may comprise a selected row and said application of said control voltages is made through the gate electrode corresponding to that alternate one of said n rows that is then selected.

18. A charge-transfer imager of the line transfer type comprising:
a substrate,
means for dividing said substrate into a predetermined two-dimensional array of spaced charge-storage islands that communicate with one another through charge-transfer regions, said array defining a substantially uniform spatial distribution pattern of said storage islands and transfer regions,
wherein said storage islands are arranged in n spaced rows numbered 1, 2 . . . (n−1), n, with each row comprised of a plurality of spaced islands and with each island of each row being coupled through respective individual transfer regions to each of first and second neighboring islands of an adjacent row on one side thereof and also to each of first and second islands of an adjacent row on the other side thereof,
wherein said spatial distribution pattern is such that any selected row and at least one of the rows adjacent thereto forms a charge-transfer register for a separate line of picture elements in response to the application of predetermined control voltage signals to at least said selected row of the rows forming said charge-transfer register,
wherein said means for dividing comprises a set of separate spaced potential barriers having given locations on the surface of said substrate in accordance with said two-dimensional array for defining said spatial distribution pattern,
wherein said predetermined array is such that there is a given center-to-center spacing distance between successive potential barriers in a row, and the positions of the potential barriers of even rows are offset with respect to those of odd rows by substantially one-half the given center-to-center spacing distance, further comprising a set of n given-shaped gate electrodes each extending in said row direction, each individual gate electrode being positioned in cooperative spatial relationship with a different one of said rows, wherein each charge-transfer register comprises a selected pair of adjacent rows, and wherein said application of predetermined control voltages is made to said selected pair of adjacent rows through the adjacent pair of gate electrodes corresponding to that selected adjacent row pair, and wherein said predetermined array is such that the space between adjacent edges of successive potential barriers in any row is divided substantially equally into a transfer region followed by a contiguous storage island; thereby to produce a checkerboard spatial distribution pattern of storage islands and transfer regions.

19. The imager defined in claim 18, wherein the respective gate electrodes of said odd rows and of said even rows are in overlapping relationship with each other.

20. A charge-transfer imager of the line transfer type comprising:

a substrate, means for dividing said substrate into a predetermined two-dimensional array of spaced charge-storage islands that communicate with one another through charge-transfer regions, said array defining a substantially uniform spatial distribution pattern of said storage islands and transfer regions, wherein said storage islands are arranged in n spaced rows numbered 1, 2 ... (n−1), n, with each row comprised of a plurality of spaced islands and with each islands of each row being coupled through respective individual transfer regions to each of first and second neighboring islands of an adjacent row on one side thereof and also to each of first and second islands of an adjacent row on the other side thereof, wherein said spatial distribution pattern is such that any selected row and at least one of the rows adjacent thereto forms a charge-transfer register for a separate line of picture elements in response to the application of predetermined control voltage signals to at least said selected row of the rows forming said charge-transfer register, wherein said means for dividing comprises a set of separate spaced potential barriers having given locations on the surface of said substrate in accordance with said two-dimensional array for defining said spatial distribution pattern, wherein said predetermined array is such that there is a given center-to-center spacing distance between successive potential barriers in a row, and the positions of the potential barriers of even rows are offset with respect to those of odd rows by substantially one-half the given center-to-center spacing distance, further comprising a set of n given-shaped gate electrodes each extending in said row direction, each individual gate electrode being positioned in cooperative spatial relationship with a different one of said rows, wherein each charge-transfer register comprises a selected pair of adjacent rows, and wherein said application of predetermined control voltages is made to said selected pair of adjacent rows through the adjacent pair of gate electrodes corresponding to that selected adjacent row pair, and wherein each gate electrode includes a plurality of spaced predetermined widened sections each of which is disposed intermediate said potential barriers of the row corresponding to that gate electrode, each of said widened sections defining a separate storage island, and wherein each gate electrode also includes a separate first narrow extension from each widened section of that gate electrode which terminates in overlapping relationship with said first neighboring island thereto of an adjacent row on one side thereof and a separate second narrow extension from each widened section of that gate electrode which terminates in overlapping relationship with said first neighboring island thereto of an adjacent row on the other side thereof, each of said narrow extensions defining a transfer region.

21. A charge-transfer imager of the line transfer type comprising:

a substrate, means for dividing said substrate into a predetermined two-dimensional array of spaced charge-storage islands that communicate with one another through charge-transfer regions, said array defining a substantially uniform spatial distribution pattern of said storage islands and transfer regions, wherein said storage islands are arranged in n spaced rows numbered 1, 2 ... (n−1), n, with each row comprised of a plurality of spaced islands and with each island of each row being coupled through respective individual transfer regions to each of first and second neighboring islands of an adjacent row on one side thereof and also to each of first and second islands of an adjacent row on the other side thereof, wherein said spatial distribution pattern is such that any selected row at least one of the rows adjacent thereto forms a charge-transfer register for a separate line of picture elements in response to the application of predetermined control voltage signals to at least said selected row of the rows forming said charge-transfer register, wherein said means for dividing comprises a set of separate spaced potential barriers having given locations on the surface of said substrate in accordance with said two-dimensional array for defining said spatial distribution pattern, wherein said predetermined array is such that there is a given center-to-center spacing distance between successive potential barriers in a row, and the positions of the potential barriers of even rows are offset with respect to those of odd rows by substantially one-half the given center-to-center spacing distance, further comprising a set of n given-shaped gate electrodes each extending in said row direction, each individual gate electrode being positioned in cooperative spatial relationship with a different one of said rows, wherein each charge-transfer register comprises a selected pair of adjacent rows, and wherein said application of predetermined control voltages is made to said selected pair of adjacent rows through the adjacent pair of gate electrodes corresponding to that selected adjacent row pair, and wherein said predetermined array is such that:

each of said potential barriers has a substantially rectangular shape, said potential-barrier rectangular shape having a given length in said row direction which is less than said center-to-center spacing distance between successive potential barriers in a row, each of said transfer regions of a row having a substantially rectangular shape, said transfer-region rectangular shape having a length in said row direction which is small relative to said given length and having a height in a direction perpendicular to said row direction that extends the entire distance between respective potential barriers of adjacent rows on either side of said first-mentioned row, with the leading edge of each transfer region being substantially aligned with the leading edges of said respective potential barriers of adjacent rows on either side of said first-mentioned row, and each storage island being defined by the potential barriers and charge-transfer regions surrounding that island.

22. The imager defined in claim 21, wherein each gate electrode is comprised of a plurality of rectangular-shaped sections each of which is associated with the space between successive potential barriers of a row, each section having a length in said row direction substantially equal to the entire spacing distance between successive potential barriers of a row and having a height in a direction perpendicular to said row direction equal to the entire spacing distance between potential barriers of adjacent rows to said first-mentioned row on either side thereof.

23. The imager defined in claim 21, wherein each section of a gate electrode is comprised of first and second overlapping layers, and wherein the first layer of each section of a gate electrode of a row is in overlapping relationship with the second layer of first and second neighboring sections thereto of each of the gate electrodes of adjacent rows on either side of the gate electrodes of said first-mentioned row.

24. A charge-transfer imager of the line transfer type comprising;

a substrate, means for dividing said substrate into a predetermined two-dimensional array of spaced charge-storage islands that communicate with one another through charge-transfer regions, said array defining a substantially uniform spatial distribution pattern of said storage islands and transfer regions, wherein said storage islands are arranged in n spaced rows numbered 1, 2 ... (n−1), n, with each row comprised of a plurality of spaced islands and with each island of each row being coupled through respective individual transfer regions to each of first and second neighboring islands of an adjacent row on one side thereof and also to each of first and second islands of an adjacent row on the other side thereof, wherein said spatial distribution pattern is such that any selected row and at least one of the rows adjacent thereto forms a charge-transfer register for a separate line of picture elements in response to the application of predetermined control voltage signals to at least said selected row of the rows forming said charge-transfer register, wherein said means for dividing comprises a set of separate spaced potential barriers having given locations on the surface of said substrate in accordance with said two-dimensional array for defining said spatial distribution pattern, wherein said predetermined array is such that there is a given center-to-center spacing distance between successive potential barriers in a row, and the positions of the potential barriers of even rows are offset with respect to those of odd rows by substantially one-half the given center-to-center spacing distance, further comprising a set of gate electrodes, each extending in said row direction, which are positioned in cooperative spatial relationship with only alternate ones of said n rows, said substrate being doped to provide buried channel charge-transfer and being further selectively doped to provide, in the absence of control voltages to said gate electrodes, potential wells of different depths for said charge-storage islands of said alternate ones and the remaining ones of said n rows and for said charge-transfer regions of said alternate ones and the remaining ones of said n rows, such that (1) the potential well of a storage island of an alternate row is deeper than a transfer region thereof, (2) the potential well of a transfer region of a remaining row is deeper than a storage island of an alternate row, and (3) the potential well of a storage island of a remaining row is deeper than a transfer region thereof, and wherein only any of said alternate ones of said n rows may comprise a selected row and said application of said control voltages is made through the gate electrode corresponding to that alternate one of said n rows that is then selected.

* * * * *